United States Patent [19]
Park et al.

[11] Patent Number: 5,671,178
[45] Date of Patent: Sep. 23, 1997

[54] ERASE VERIFYING CIRCUIT FOR A NONVOLATILE SEMICONDUCTOR MEMORY WITH COLUMN REDUNDANCY

[75] Inventors: Jong-wook Park, Seoul; Young-ho Lim, Kyungki-do, both of Rep. of Korea

[73] Assignee: Samsung Electronics Co., Ltd., Duwon, Rep. of Korea

[21] Appl. No.: 597,891

[22] Filed: Feb. 5, 1996

[30] Foreign Application Priority Data

Feb. 4, 1995 [KR]  Rep. of Korea ................. 95-2007

[51] Int. Cl.$^6$ .................................................. G11C 16/06
[52] U.S. Cl. ................. 365/185.22; 365/185.09; 365/185.12; 365/185.17; 365/185.23; 365/185.33; 365/189.05; 365/230.06
[58] Field of Search .................. 365/185.22, 185.09, 365/185.11, 185.12, 185.17, 185.23, 185.33, 189.05, 230.06

[56] References Cited

U.S. PATENT DOCUMENTS 5,473,563  12/1995  Suh et al. ..................... 365/185.13
5,515,324  5/1996  Tanaka ....................... 365/185.09

Primary Examiner—David C. Nelms
Assistant Examiner—Andrew Q. Tran
Attorney, Agent, or Firm—Cushman Darby & Cushman, IP Group Of Pillsbury Madison & Sutro LLP

[57] ABSTRACT

An EEPROM with improved reliability irrespective of the occurrence of an open normal bit line includes an array of rows and columns of floating gate type normal and redundant memory cells, a plurality of normal bit lines each connected to the normal memory cells in a corresponding column of the array, a plurality of redundant bit lines each connected to the redundant memory cells in a corresponding column of the array, and a page buffer connected to the normal and redundant bit lines for sensing and storing pass and fail data read-out from selected normal cells in a desired row during an erase verifying operation of the memory after erasure of the selected normal memory cells. The page buffer stores pass data representing successful erasure of the selected normal memory cells and fail data associates with at least one defective normal bit line. A data changing circuit is connected to the page buffer to change the fail data associated with the defective bit line stored in the page buffer into pass data.

4 Claims, 10 Drawing Sheets

ERASE VERIFYING CIRCUIT FOR A NONVOLATILE SEMICONDUCTOR MEMORY WITH COLUMN REDUNDANCY

BACKGROUND OF THE INVENTION

1. Field of the Invention

The present invention relates to a nonvolatile semiconductor memory, and more particularly to an erase verifying circuit for a nonvolatile semiconductor memory having a column redundancy.

2. Description of the Related Art

Nonvolatile semiconductor memories, such as, electrically erasable and programmable read only memories (EEPROMs), are tending toward higher density memory capacity in connection with developments in manufacturing. Although various manufacturing processes, such as a fine etching process, have been developed to increase the memory capacity without increasing the area required on a semiconductor chip, defects occur in the memory cells due to variations in the manufacturing process, thereby reducing the production yield.

To enhance production yield, a redundant technique has been used in which a memory cell array includes a normal memory cell array having a plurality of normal memory cells, and a redundant memory cell array having a plurality of redundant memory cells. When any one of the normal memory cells within the normal memory cell array is defective or fails, a redundant memory cell within the redundant memory cell array is substituted for the defective normal memory cell. The redundancy may be classified into row redundancy, in which a normal row line (or word line) connected to a defective normal cell is replaced by a redundant row line (or word line) connected to a defect-free redundant memory cell, and column redundancy, in which a normal column line connected to a defective normal memory cell is replaced by a redundant column line connected to a defect-free redundant memory cell.

To enhance read-out speed, conventional EEPROMs perform a page read operation which reads data from all memory cells connected to a selected word line at a time. To perform this operation, each of a plurality of column lines (or bit lines) is connected to a data latch which temporarily stores the read-out data from a corresponding memory cell. The data latches connected with the plurality of column lines are referred to as a page buffer. Data stored in the page buffer is sequentially output at a predetermined number of bits, such as four bits, eight bits or sixteen bits at a time, via a column selection circuit to data input/output terminals.

Prior to a write operation, EEPROMs must perform an erase operation. After the erase operation, an erase verifying operation is also performed to determine if the erased memory cells were erased so as to have desired threshold voltages. As a result of the erase verification, if any one of the erased memory cells was not erased successfully, erasure and erase verifying operations are again performed.

Erasure of an EEPROM is performed for all memory cells arranged in a matrix form of rows and columns or for memory cells in a block which are connected to a row or to a plurality of adjacent rows. Each of the memory cells is a floating gate type N-channel MOSFET which is formed in a P-type well region on one surface of a semiconductor substrate. Each memory cell includes source and drain regions separated by a channel region in the P-type well region, a tunnel oxide film formed on the channel region between the source and drain regions, a floating gate of polysilicon formed on the tunnel oxide film and a control gate formed over the floating gate via a dielectric film.

Erasure of all memory cells is accomplished by applying an erase potential, such as 18 volts, to the well region and applying a reference potential, such as a ground potential, to word lines connected to control gates of the memory cells. Then, electrons stored by the floating gates of the memory cells are extracted to the well regions by Fowler-Nordheim tunneling (F-N tunneling), and thereby the memory cells are changed into depletion mode transistors with negative threshold voltages.

On the other hand, erasure of a portion of memory cells, i.e. erasure of memory cells within a selected row block, is accomplished by applying the erase potential to the well region and the ground potential to word lines connected to the memory cells in the selected row block, and floating word lines in the unselected row blocks. Then, the word lines of unselected row blocks are capacitively coupled to the erase potential, thereby causing the memory cells thereof to be inhibited from erasing. However, since the word lines of the selected row block maintain the ground potential, the memory cells of the selected row block are erased by F-N tunneling. Where each of the memory cells is erased to a desired threshold voltage, the memory cells are in conductive states when the ground potential is applied to word lines connected thereto. Such a conductive state for each of the erased memory cells will be referred to as an on-cell.

After the erasure, erase verification is performed by applying an erase verifying potential, such as, for example, a ground potential, to a word line of the selected row block and providing a sensing current to column lines, i.e. bit lines, connected to drains of memory cells of the selected row block. If the memory cells of the selected row block were successfully erased with desired threshold voltages, the page buffer connected to the bit lines maintains an initial reset state since these memory cells are on-cells, and a pass/fail circuit connected to the output of the page buffer outputs a pass signal, thereby indicating that these memory cells have been successfully erased. Alternatively, if any one of these memory cells was not successfully erased, the memory cell has not been erased functions as an off-cell representing a nonconductive state during the erase verification.

Therefore, the bit line connected to this memory cell is charged to a predetermined voltage by the sensing current, and the data latch connected thereto latches a fail data representing a fail state, i.e. a complement state of the initial reset state. As a result, the pass/fail circuit outputs a fail signal. Erasing and erase verifying operations may be performed repeatedly in the above discussed manner until all memory cells are successfully erased. These operations are disclosed in U.S. patent application Ser. No. 08/523,612, filed by the assignee of the present application, the disclosure of which is hereby incorporated by reference.

However, an open normal bit line, such as a bit line severed during the manufacturing process, always represents a fail state irrespective of the erase states of normal memory cells connected to the open normal bit line. Therefore, the erase verification still indicates a fail state, even if the erasure is performed over a number of cycles. The fail state for such an open normal bit line still takes place, even if the open normal bit line is replaced by a redundant bit line (or a redundant column line), because the data latch connected to the open normal bit line always stores the fail data each time the erase verification is performed. Therefore, a serious problem is incurred which cannot be solved with the use of column redundancy for at least one open normal bit line.

SUMMARY OF THE INVENTION

Therefore, it is an object of the present invention to provide an EEPROM with a reliability which is operable irrespective of the occurrence of an open normal bit line.

According to a first aspect of the present invention, a nonvolatile semiconductor memory includes an array of rows and columns of floating gate type normal and redundant memory cells. A plurality of normal bit lines are connected to the normal memory cells in a corresponding column of the array, a plurality of redundant bit lines are connected to the redundant memory cells in a corresponding column of the array, and a page buffer is connected to the normal and redundant bit lines for sensing and storing pass and fail data read-out from selected normal memory cells in a desired row during an erase verifying operation of the memory after erasure of the selected normal memory cells. In this device, pass data represents successful erasure of the selected normal memory cells and fail data is associated with at least one defective normal bit line. Further, a data changing circuit is connected to the page buffer for changing the fail data stored in the page buffer into the pass data.

According to another aspect of the present invention, a method of verifying erasure of selected memory cells after they have been erased includes the step of changing fail data stored in the data latch into pass data, so that the erasure may be verified irrespective of the occurrence of a defective bit line. Preferably this method is employed in a nonvolatile semiconductor memory, having a plurality of bit lines respectively connected to selected memory cells, a plurality of sensing circuits respectively connected to the bit lines for sensing pass data when the selected memory cells were successfully erased and fail data when at least one of the bit lines was defective, and a plurality of data latches respectively connected to the sensing circuit for storing the pass and fail data.

BRIEF DESCRIPTION OF THE DRAWINGS

The preferred embodiments of the present invention will now be described more specifically with reference to the attached drawings, in which like references indicate similar elements or parts, wherein.

DETAILED DESCRIPTION OF THE PREFERRED EMBODIMENT

A method and circuit for providing column redundancy in an EEPROM is disclosed. In the following description, numerous specific details are set forth, such as the kind of memory cells, for example, NAND structured or NOR structured memory cells, the value of various voltages, circuit elements or parts, and so on, in order to provide a thorough understanding of the present invention. It will be obvious, however, to those skilled in the art that these specific details need not be employed to practice the present invention.

An example of an EEPROM of the present invention is fabricated by using CMOS manufacturing technologies on a common chip, in which depletion mode n-channel MOS transistors each having a threshold voltage of about −1.8 volts (hereinafter, referred to as D-type transistors), enhancement mode n-channel MOS transistors each having a threshold voltage of about 0.7 volts (hereinafter, referred to as N-type transistors) and p-channel MOS transistors each having a threshold voltage of about −0.9 volts (hereinafter, referred to as P-type transistors).

Figure 1:
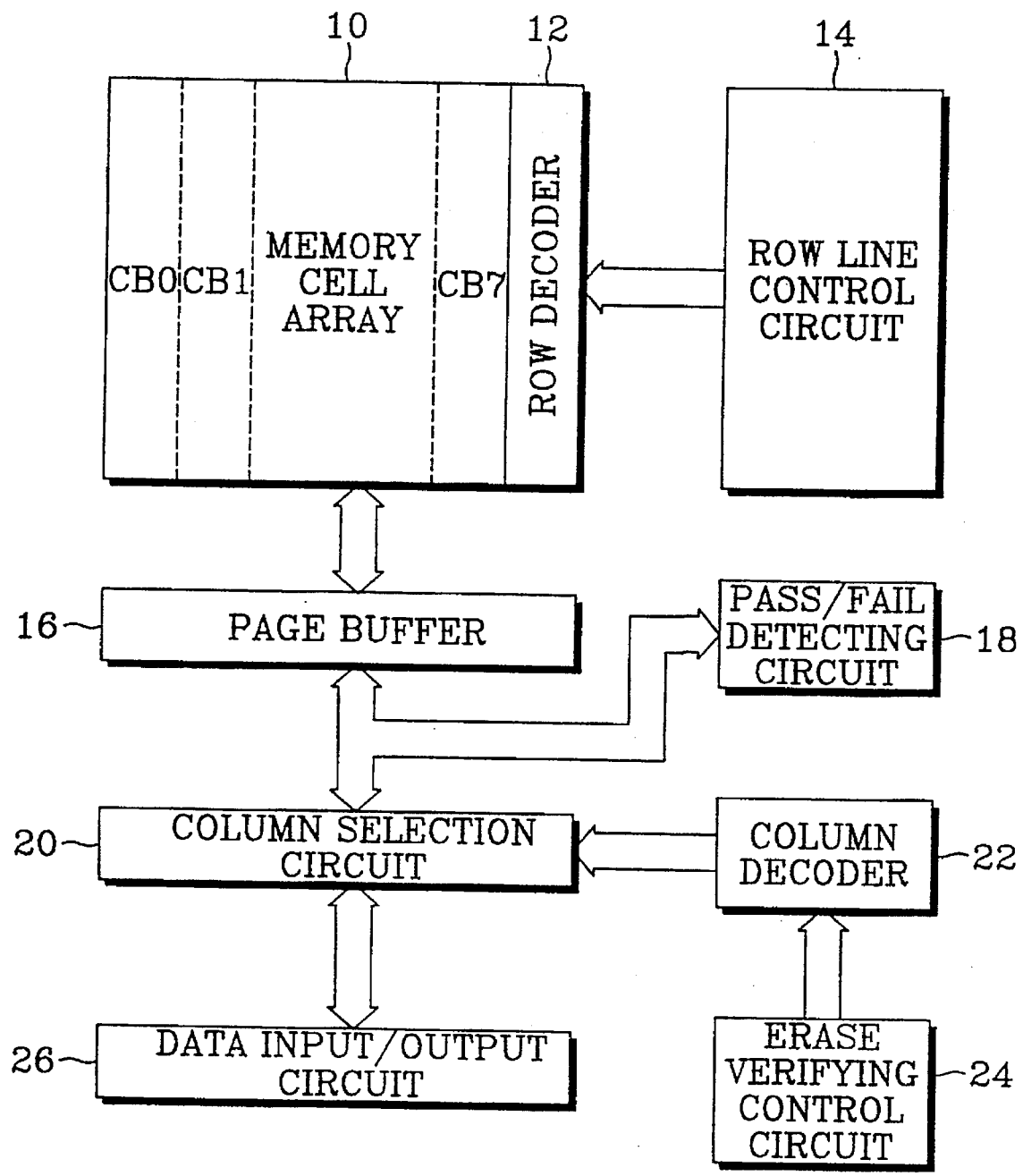
FIG. 1 is a block diagram of an erase verifying circuit according to a preferred embodiment of the present invention.

FIG. 1 is a block diagram of an erase verifying circuit illustrating a preferred embodiment of the present invention. Referring to the drawing, a memory cell array 10 includes a plurality of NAND cell units (hereinafter, referred to as cell units) arranged in a matrix form of rows and columns. Each cell unit includes a first selection transistor, a plurality of memory cells and a second selection transistor whose drain-source paths are connected in series. The drain of the first selection transistor within each cell unit is connected to a corresponding one of bit lines extending in the column direction, and the source of the second selection transistor within each cell unit is connected to a common source line. As discussed above, the cell units are formed in a p-type well region on one surface of the semiconductor substrate. The control gates of memory cells in each of rows are connected to a corresponding one of word lines, and the gates of the first and second selection transistors are respectively connected to first and second selection lines each of which extends in the row direction. Such an arrangement of memory cells is disclosed in U.S. Pat. No. 5,473,563, issued on Dec. 5, 1995 and assigned to the assignee of the present invention, the content of which is hereby incorporated by reference.

The memory cell array 10 includes a plurality of row blocks each of which includes a plurality of cell units in the same row. The memory cell array 10 is also divided into eight groups of a plurality of bit lines, and each group forms a column block. A portion of bit lines within each one of the eight column blocks CB0–CB7 are redundant bit lines, and the remaining bit lines thereof are normal bit lines. Memory cells connected to the redundant bit lines are referred to as redundant memory cells, and memory cells connected to the normal bit lines are referred to as normal memory cells.

A row decoder 12 serves to respond to control signals from a row line control circuit 14, select one of row blocks and provide proper operation voltages on a selected word line and unselected word lines within the selected row block according to various modes of operation, such as erase, write, read, erase verifying and write verifying modes of operation. The row decoder providing such operation voltages according to the various modes of operation is disclosed in the above mentioned U.S. Pat. No. 5,473,563, the content of which is hereby incorporated by reference.

A page buffer 16 includes a plurality of data latches connected to normal and redundant bit lines, respectively. The page buffer 16 serves to store pass data or fail data complementary to the pass data, which indicates if selected normal and redundant memory cells are successfully erased during the erase verifying operation. The page buffer 16 includes a sensing circuit serving to provide sensing current to the normal and redundant bit lines, and to sense the pass or fail data during the erase verifying operation.

A pass/fail detecting circuit 18 is connected to the outputs of the data latches constituting the page buffer 16, and serves to determine if the selected normal and redundant memory cells are successfully erased in response to the data stored in the data latches during the erase verifying operation. That is, where all of the data latches store pass data, the pass/fail detecting circuit 18 outputs a pass signal representing the successful erasure of the selected normal and redundant memory cells, while where any one of the data latches stores a fail data, the pass/fail detecting circuit 18 outputs a fail signal representing the unsuccessful erasure thereof.

A column selection circuit 20, a column decoder 22 and an erase verifying control circuit 24 form a data changing circuit according to the present invention. The data changing circuit serves to change the fail data, which is stored in a data latch connected to an open normal bit line, i.e. a normal bit line severed during the manufacturing process, into pass data. The column selection circuit 20 serves to select the data latch connected to the open normal bit line in order to change the fail data stored in the data latch into pass data during the erase verifying operation. The erase verifying control circuit 24 stores an address of at least one open normal bit line, provides this address to the column decoder 22, and thereby the column selection circuit 20 causes the fail data, which is stored in the data latch connected to the normal bit line associated with the address, to be changed into pass data.

The data input/output circuit 26 is connected to the column selection circuit 20, and serves to latch data from data input/output terminals during a write operation and to provide read-out data to the data input/output terminals during a read operation. The data input/output circuit 26 also serves to latch command signals from the data input/output terminals and then to provide the command signals to a command register (not shown).

Figure 2:
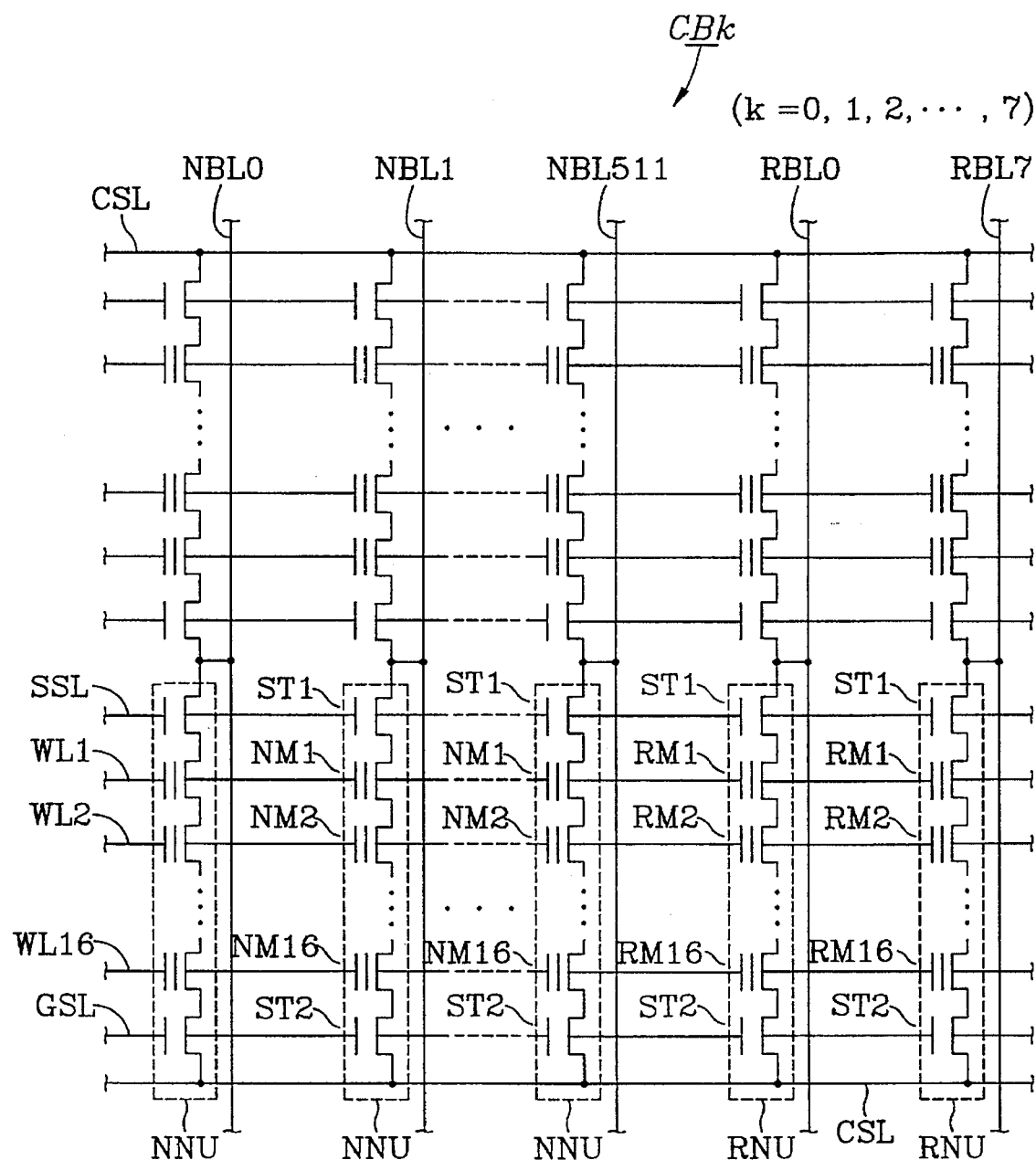
FIG. 2 is an equivalent circuit diagram representing a portion of one column block of a memory cell array.

FIG. 2 is an equivalent circuit illustrating a portion of the memory cell array of FIG. 1. For the convenience of illustration, cell units associated with two rows of a k-th column block are shown. Cell units in each row provide a row block includes normal cell units NNU and redundant cell units RNU. Each of normal cell units NNU includes a first selection transistor ST1, normal memory cells NM1~NM16 and the second selection transistor ST2 whose drain-source paths are connected in series. Drains of the first selection transistors ST1 in each column are connected to a corresponding one of normal bit lines NBL0~NBL511, and source of the second selection transistors ST2 in each row are connected to a corresponding one of common source lines CSL. Each of redundant cell units RNU includes the first selection transistor ST1, redundant memory cells RM1~RM16 and the second selection transistor ST2 whose drain-source paths are connected in series. Drains and sources of the first and second selection transistors ST1 and ST2 are connected to a corresponding one of redundant bit lines RBL0~RBL7 and a corresponding one of common source lines CSL, respectively. Although the column block CBk (k=0,1,2, . . . ,7), as shown in FIG. 2, has 512 normal bit lines NBL0~NBL511 and 8 redundant bit lines RBL0~RBL7, it should be noted that the present invention is not limited to the number of the bit lines. Further, the redundant bit lines RBL0~RBL7 in each column block CBk may also be arranged such that they are arranged in a divided fashion on both sides of the normal memory cell array.

The preferred embodiment of the present invention will be explained in connection with an interleaved bit line scheme capable of accomplishing high density memory capacity without increasing the area required on the chip. The interleaved bit line scheme is a scheme whereby first and second page buffers are respectively positioned at the upper and lower side portions of the memory cell array and bit lines are alternately connected to the first and second page buffers. Such a scheme is disclosed in U.S. patent application Ser. No. 08/547,970, filed Dec. 19, 1995 and assigned to the assignee of the present invention, the content of which is hereby incorporated by reference.

Figure 3:
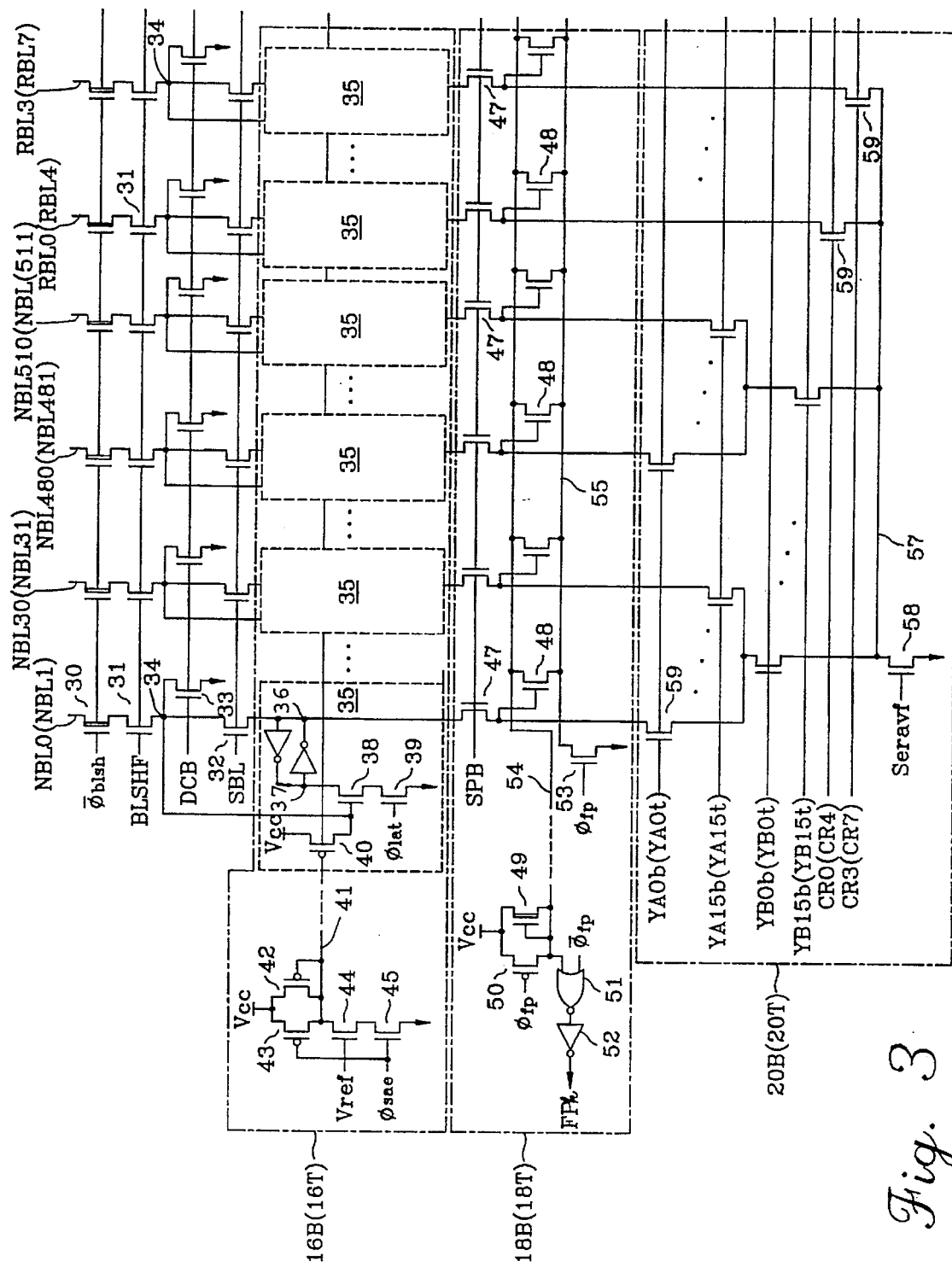
FIG. 3 is a schematic circuit diagram of a page buffer, column selection circuit and pass/fail detecting circuit which are related to one of the column blocks of FIG. 1.

FIG. 3 is a schematic circuit diagram of the page buffer, column selection circuit and pass/fail detecting circuit which are associated with the column block CBk. Each of lower ends of normal and redundant bit lines NBL0, NBL2, NBL4, . . . , NBL510 and RBL0~RBL3 in the column block CBk are connected to the drain of a D-type transistor 30. Drain-source paths of the transistor 30 and N-type transistors 31 and 32 in each column are connected in series. Drain-source paths of N-type transistors 33 are respectively connected between source-to-drain connecting points 34 of the transistors 31 and 32 and a ground potential Vss. Gates of the transistors 30–33 are respectively connected to control signals $\bar{\phi}_{blsh}$, BLSHF, SBL and DCB. Data latches 35 of the lower page buffer 16B are respectively connected to sources of the transistors 32. Each data latch 35 includes a latch, which includes a pair of cross-coupled inverters between first and second nodes 36 and 37, N-type sensing transistors 38 and 39 whose drain-source paths are connected in series between the second node 37 and the ground potential Vss, and a P-type current source transistor 40 connected between a power supply potential Vcc and the gate of the transistor 38. Gates of the transistors 38 and 39 are respectively connected to the connecting point 34 and a control signal $\phi_{lat}$. Gate of the current source transistors 40 are connected to a line 41, one end of which is connected to a reference portion of a current source circuit, which includes P-type transistors 42 and 43 and N-type transistors 44 and 45. The reference portion and current source transistors 40 form the current source circuit of a current mirror type.

A lower pass/fail detecting circuit 18B includes N-type transistors 47, 48, and 53, a D-type transistor 49, a P-type transistor 50, a NOR gate 51 and an inverter 52. Drains of the transistors 47 are respectively connected to the first nodes 36, and sources of the transistors 47 are respectively connected to gates of the transistors 48. Drain-source paths of the transistors 48 are connected in parallel between lines 54 and 55. A drain-source path of the transistor 53 is connected between the line 55 and the ground potential Vss. The gate of the transistor 53 is connected to a pass/fail control signal $\phi_{fp}$. Drain-source paths of the transistors 49 and 50 are connected in parallel between the power supply potential Vcc and one end of the line 54. The gate of the transistor 49 is connected to the line 54. The gate of the transistor 50 is connected to the control signal $\phi_{fp}$. Two input terminals of th NOR gate 51 are respectively connected to the one end of the line 54 and the complement $\overline{\phi}_{fp}$ of the control signal $\phi_{fp}$. The output of the NOR gate 51 provides a pass/fail determining signal FPk associated with the k-th column block via the inverter 52.

A lower column selection circuit 20B responds to lower decoding signals YA0b~YA15b and YB0b~YB15b and lower redundant column selection signals CR0~CR3. The lower column selection circuit 20B includes an N-type transistor 58, whose drain-source path is connected between a data line 57 and the ground potential Vss, for changing the fail data into the pass data during the erase verifying operation according to the feature of the present invention, and selection transistors 59. The gate of the data changing transistor 58 is connected to the complement signal $\overline{S}_{eravf}$ of an erase verifying flag signal $\overline{S}_{eravf}$.

The construction of the upper page buffer 16T, upper pass/fail detecting circuit 18T and upper column selection circuit 20T is identical to that of the lower page buffer 16B, lower pass/fail detecting circuit 18B and lower column selection circuit 20B except that data latches 35 forming the upper page buffer 16T are respectively connected to upper ends of normal bit lines NBL1, NBL3, NBL5, . . . , NBL511 and redundant bit lines RBL4~RBL7, and the upper column selection circuit 20T responds to the upper normal column selection signals YA0t~YA15t and YB0t~YB15t and upper redundant column selection signals CR4~CR7.

Figure 4:
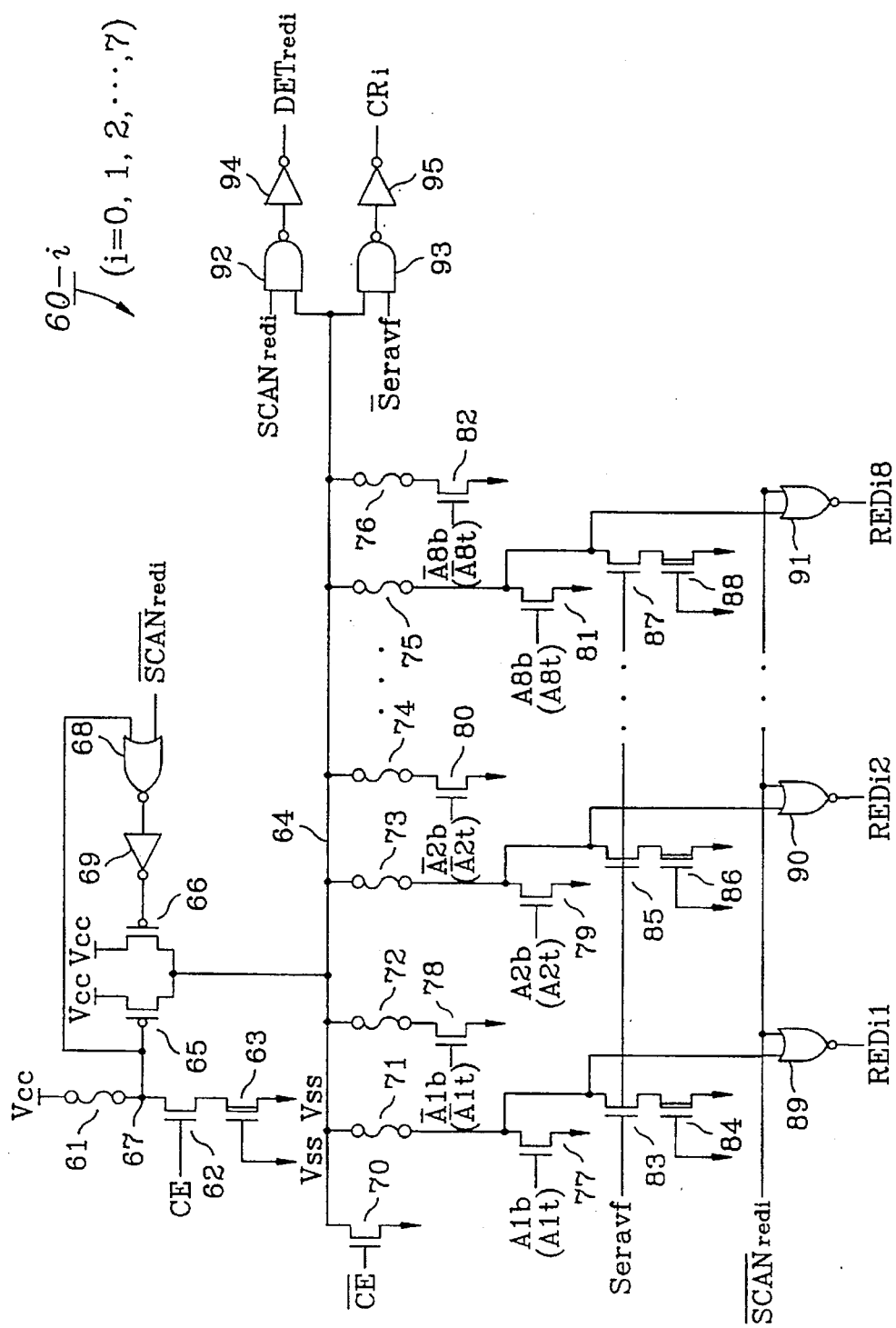
FIG. 4 is a schematic circuit diagram of a defective column program circuits of the erase verifying control circuit of FIG. 1.

FIG. 4 is a schematic circuit diagram of defective column program circuits. The number of the defective column program circuits 60-i forming a portion of the erase verifying control circuit 24 is equal to the number of redundant bit lines in each column block. Each defective column program circuit serves to store a defective column address, provide defective column address signals during the erase verifying operation, and specify a redundant bit line with the stored address during the read or write operation. Circuit portions 60-0~60-3 of the defective column program circuits 60-i are associated with the lower column selection circuit 20B, and the remaining circuit portions 60-4~60-7 are associated with the upper column selection circuit 20T.

Each of the defective column program circuits 60-i includes a master fuse 61, an N-type transistor 62 and a D-type transistor 63 whose drain-source paths are connected in series-between the power supply potential Vcc and the ground potential Vss. The gate of the transistor 62 is connected to a chip enable signal CE staying at an "H" level during an operation of the chip. To prevent current consumption, the gate of the transistor 63 having a long channel length is connected to the ground potential Vss. The master fuse 61 is first blown by a laser beam when an address specifying a defective normal bit line is programmed. Source-drain paths of P-type transistors 65 and 66 are connected in parallel between the power supply potential Vcc and a line 64. The gate of the transistor 65 is connected to a connecting point 67 between the master fuse 61 and the drain of the transistor 62. Two input terminals of a NOR gate 68 are respectively connected to the connecting point 67 and the complement $\overline{SCAN}_{redi}$ of a defective column address loading control signal $SCAN_{redi}$ which defines a column address loading period for the defective normal bit line. The output of the NOR gate 68 is connected to the gate of the transistor 66 via an inverter 69. The drain of an N-type transistor 70 and a first end of each of fuses 71~76 are connected to the line 64. The source and gate of the transistor 70 are respectively connected to the ground potential Vss and the complement $\overline{CE}$ of the chip enable signal CE. Drain-source paths of N-type transistors 77~82 are respectively connected between second ends of the fuses 71~76 and the ground potential Vss. Gates of the transistors 77~82 are respectively connected to normal column selection address signals A1b, $\overline{A}$1b (A1t, $\overline{A}$1t)~A8b, $\overline{A}$8b (A8t, $\overline{A}$8t) from a column address counter, as will be explained below. N-type and D-type transistor pairs 83 and 84, 85 and 86 and 87 and 88, drain-source paths of each of which are connected in series, are connected between second ends of the fuses 71, 73 and 75 and the ground potential Vss, respectively. Gates of the transistors 83, 85 and 87 are connected to the signal $S_{eravf}$. Gates of the transistors 84, 86 and 88, each of which has a long channel length, are connected to the ground potential Vss. First input terminals of NOR gates 89~91 are respectively connected to second ends of the fuses 71, 73 and 75, and their second input terminals are connected to the control signal $\overline{SCAN}_{redi}$. First input terminals of NAND gates 92 and 93 are connected to the line 64, and their second input terminals are connected to the signals $SCAN_{redi}$ and $\overline{S}_{eravf}$, respectively. The output of the NAND gate 92 provides a redundant detecting signal $DET_{redi}$ via an inverter 94, and the output of the NAND gate 93 outputs a redundant column selection signal CRi via an inverter 95. Blowing of fuses 71~76 to program a column address specifying a defective normal bit line associates respective N-type transistors with "H" level address signals. For example, if address signals A1b(A1t)~A8b(A8t) specifying a defective normal bit line are at "H" levels, fuses 71, 73, . . . ,75 are blown by the laser beam. Therefore, when the signal $\overline{SCAN}_{redi}$ stays at an "L" level, outputs REDi1~REDi8 of NOR gates 89~91 go to "H" levels, thereby specifying the programmed defective normal bit line.

Figure 5:
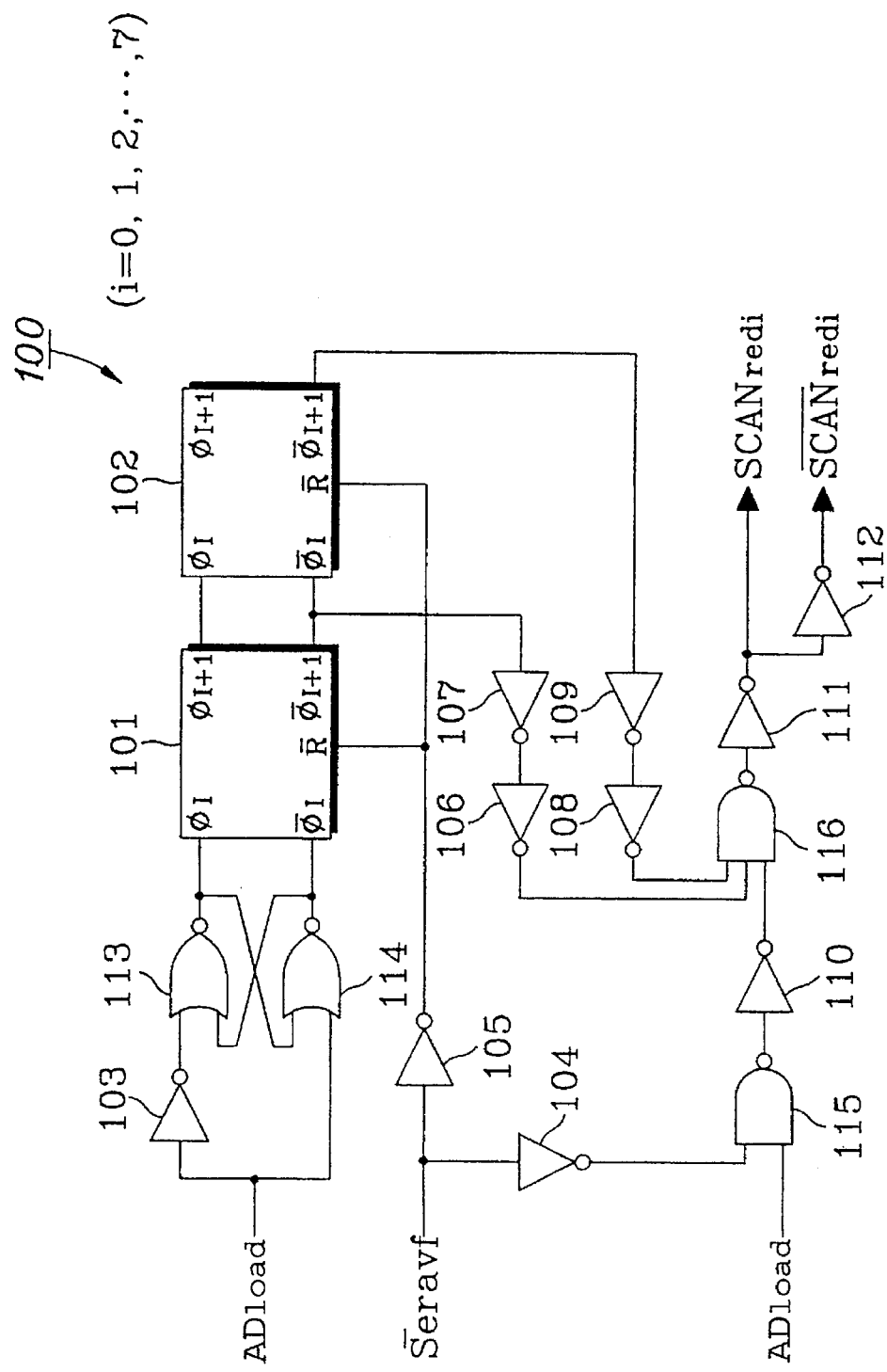
FIG. 5 is a schematic circuit diagram of a defective column address loading control signal generating circuit of the erase verifying control circuit of FIG. 1.

FIG. 5 is a schematic circuit diagram of a defective column address loading control signal generator 100 of the erase verifying control circuit of FIG. 1. Each of stages 101 and 102 for a binary counter is disclosed in Korean Patent Application No. 94-22167, filed on Sep. 3, 1994. The signal generator 100 includes the binary counter with the two stages 101 and 102, inverters 103~111, NOR gates 113 and 114 and NAND gates 115 and 116. The signal generator 100 produces the defective column address loading control signal $SCAN_{redi}$ and its complement $\overline{SCAN}_{redi}$ in response to an address loading signal $AD_{load}$ during the erase verifying operation.

Figure 6:
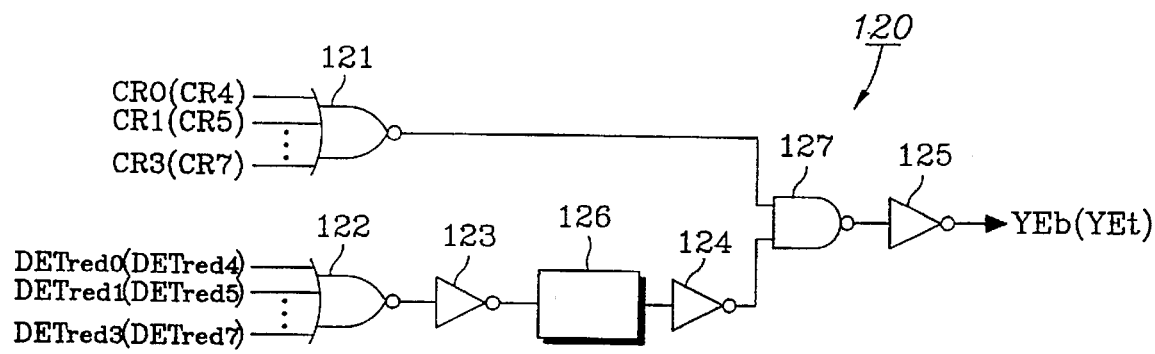
FIG. 6 is a schematic circuit diagram of a column decoder enable signal generating circuit of the erase verifying control circuit of FIG. 1.

FIG. 6 is a schematic circuit diagram of column decoder enable signal generator of the erase verifying control circuit of FIG. 1. The column decoder enable signal generator 120 includes a lower column decoder enable signal generator and an upper column decoder enable signal generator. The construction of the lower column decoder enable signal generator, which provides a lower column decoder enable signal YEb in response to the redundant column selection signals CR0~CR3 and the redundant detection signals $DET_{red0}$~$DET_{red3}$, is identical to that of the upper column decoder enable signal generator, which provides an upper column decoder enable signal YEt in response to the redundant column selection signals CR4~CR7 and the redundant detection signals $DET_{red4}$~$DET_{red7}$.

Each of the lower and upper column decoder enable signal generators includes NOR gates 121 and 122, inverters 123~125, a NAND gate 127 and a short pulse generator 126 producing a short pulse in response to the transition of its input signal from "H" level to "L" level. Since the redundant column selection signals CR0~CR7 are held at "L" levels, logic levels of the lower and upper column decoder enable signals YEb and YEt are determined by those of the redundant detection signals $DET_{red0}$~$DET_{red7}$. That is, when any one of the signals $DET_{red0}$~$DET_{red3}$ is an "H" level pulse, the lower column decoder enable signal YEb becomes an "H" level short pulse in response to the transition of the "H" level pulse to the "L" level. Similarly, when any one of the signals $DET_{red4}$~$DET_{red7}$ is an "H" level pulse, the upper column decoder enable signal YEt becomes an "H" level short pulse after the transition of the "H" level pulse to the "L" level. On the other hand, during the write and read operations, since the redundant detection signals $DET_{red0}$~$DET_{red7}$ are held at "L" levels, when any one of the redundant column selection signals CR0~CR7 goes to an "H" level, the lower or upper column decoder enable signal YEb or YEt then goes to an "L" level, thereby causing the lower or upper column decoder to be disabled.

Figure 7:
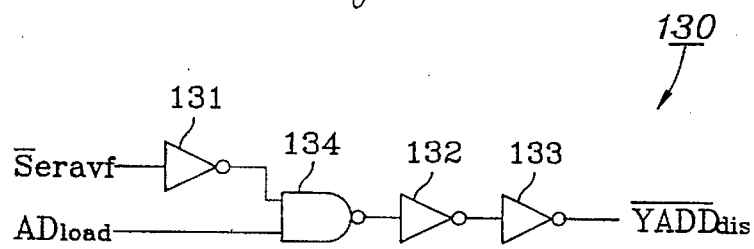
FIG. 7 is a schematic circuit diagram of a column decoder disable signal generating circuit of the erase verifying control circuit of FIG. 1.

FIG. 7 is a schematic circuit diagram of a column address disable signal generator of the erase verifying control circuit of FIG. 1. The column address disable signal generator 130 includes inverters 131~133 and a NAND gate 134. The generator 130 produces a column address disable signal $\overline{YADD}_{dis}$ in response to the address loading signal $AD_{load}$ during the erase verifying operation. The signal $\overline{YADD}_{dis}$ goes to an "L" level each time the address loading signal $AD_{load}$ goes to an "H" level.

Figure 8A:
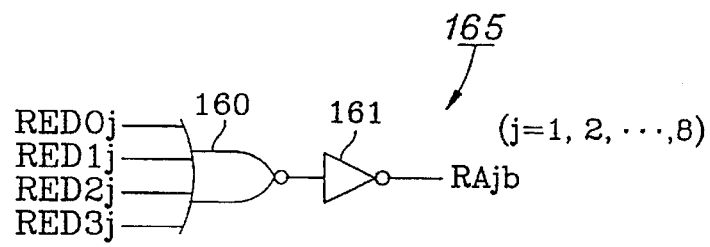
FIGS. 8A and 8B are schematic circuit diagrams of repair address signal generating circuits of the erase verifying control circuit of FIG. 1.
Figure 8B:
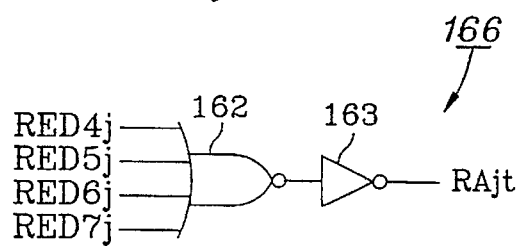

FIGS. 8A and 8B are a schematic circuit diagrams of repair address signal generators which produce repair address signals RAjb and RAjt in response to defective column address signals RED0j~RED7j (j=1, 2, ..., 8) from defective column program circuits 60-i. FIG. 8A and FIG. 8B are schematic circuit diagrams of lower and upper repair address signal generators, respectively. The lower repair address signal generator 165 includes NOR gates 160 and inverters 161, and the upper repair address signal generator 166 includes NOR gates 162 and inverters 163. The generator 165 produces lower repair address signals RAjb in response to defective column address signals RED0j~RED3j from the lower defective column program circuits 60-0~60-3 of FIG. 4. Similarly, the upper repair address signal generator 166 produces upper repair address signals RAjt in response to defective column address signals RED4j~RED7j from the upper defective column program circuits 60-4~60-7.

Figure 9:
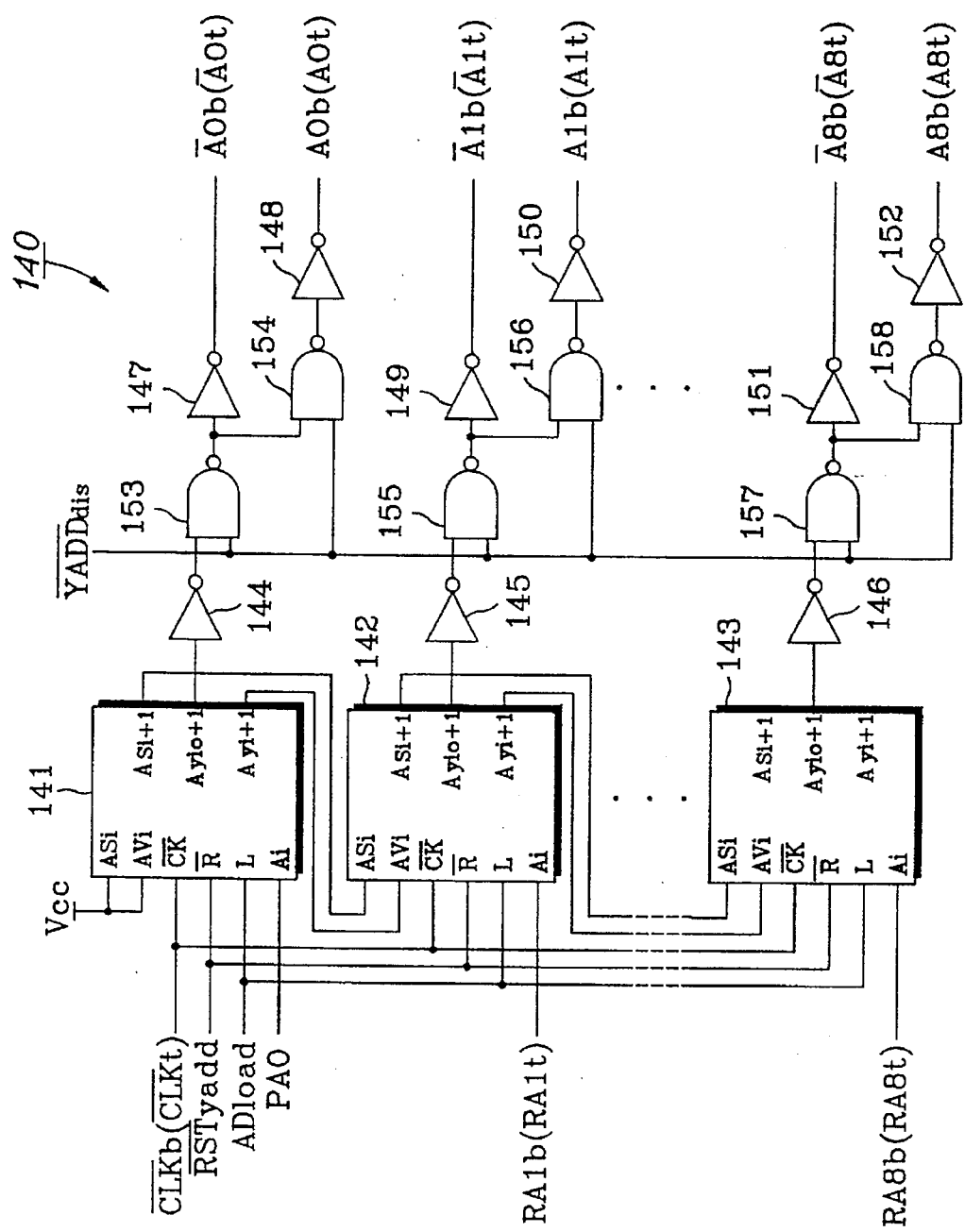
FIG. 9 is a schematic circuit diagram of a column address counter of the erase verifying control circuit of FIG. 1.

FIG. 9 is a schematic circuit diagram of a column address counter forming a portion of the erase verifying control circuit. The column address counter 140 includes a lower column address counter and an upper column address counter. The lower column address counter receives lower repair address signals RA1b~RA8b during the erase verifying operation, and serves to produce lower normal column selection address signals A1b~A8b and their complements $\overline{A1b}$~$\overline{A8b}$.

Similarly, the upper column address counter receives upper repair address signals RA1t~RA8t, and serves to produce upper normal column selection address signals A1t~A8t and their complements $\overline{A1t}$~$\overline{A8t}$. The lower and upper column address counters make the signals A1b~A8b and A1t~A8t and their complements $\overline{A1b}$~$\overline{A8b}$ and $\overline{A1t}$~$\overline{A8t}$ disabled to "L" levels in response to the column address disable signal $\overline{YADD}_{dis}$ at an "L" level.

The column address counter 140 includes counter stages 141~143, inverters 144~152 and NAND gates 153~158. Each of the stages is disclosed in U.S. patent application Ser. No. 08/537,615, filed Oct. 2, 1995 and assigned to the assignee of the present invention, the content of which is hereby incorporated by reference.

The lower and upper column address counters receive to latch lower and upper repair address signals RA1b~RA8b and RA1t~RA8t when the address loading signal $AD_{load}$ is at an "H" level. At the same time, the counters output the signals A1b, $\overline{A1b}$~A8b, $\overline{A8b}$ and A1t, $\overline{A1t}$~A8t, $\overline{A8t}$ being at "L" levels in response to the signal $\overline{YADD}_{dis}$ at the "L" level.

Thereafter, when the address loading signal $AD_{load}$ is at an "L" level, the output signals A1b~A8b and A1t~A8t from the address counters become the latched address signals. That is, the output signals A1b, $\overline{A1b}$~A8b, $\overline{A8b}$ and A1t, $\overline{A1t}$~A8t, $\overline{A8t}$ are address signals specifying a defective normal column. The first stage 141 of the counter 140 receives an address signal PA0 from the address buffer (not shown), and then produces lower and upper address signals A0b~A0t, thereby causing a multiplexer (not shown) to select lower and upper data bus during a read operation. Since this scheme is known in the art, a detailed explanation has been omitted.

Figure 10:
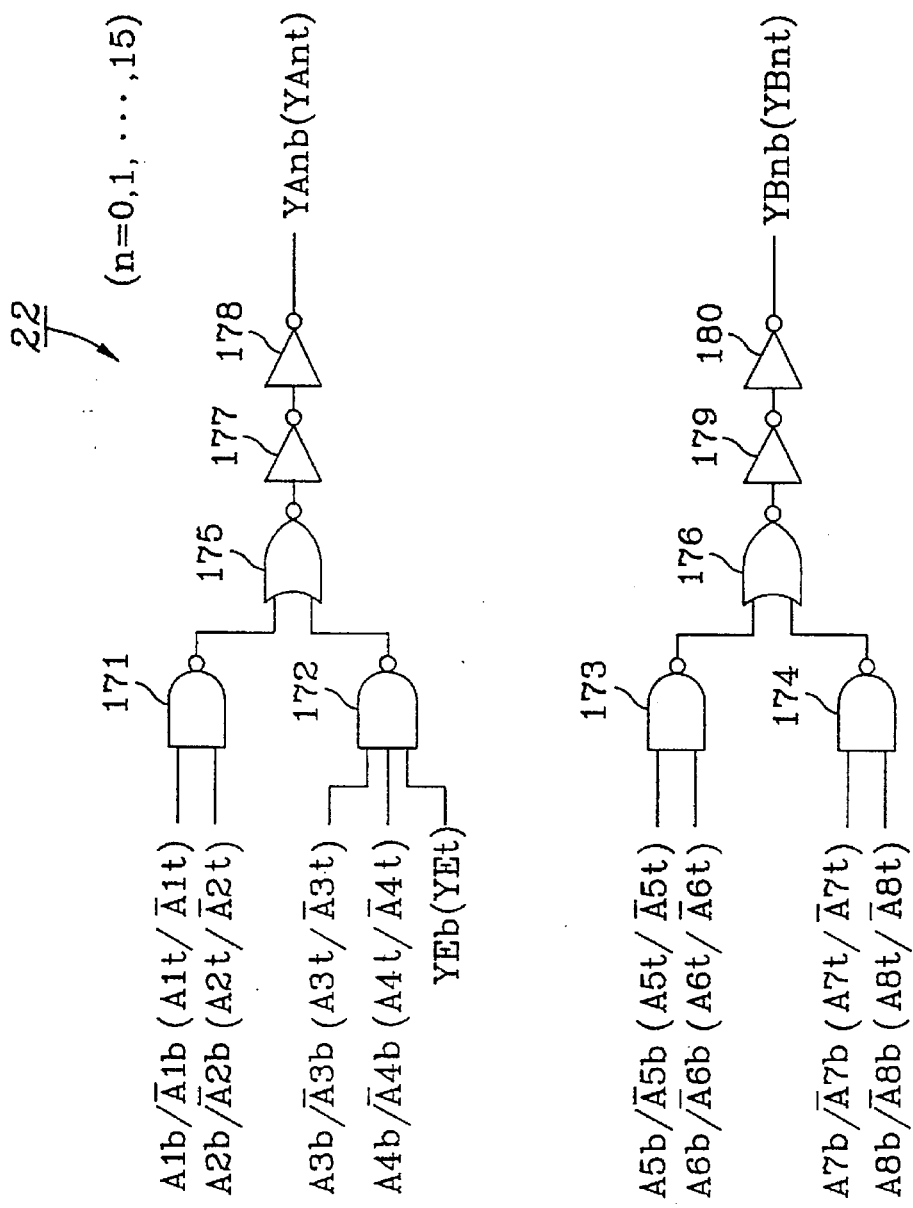
FIG. 10 is a schematic circuit diagram of a column decoder of FIG. 1.

FIG. 10 is a schematic circuit diagram of the column decoder of FIG. 1. The column decoder 22 includes a lower decoder and an upper decoder. The lower and upper decoders include NAND gates 171~174, NOR gates 175 and 176 and inverters 177~180. The lower decoder decodes lower normal column selection address signals A1b, $\overline{A1b}$~A8b, $\overline{A8b}$ from the lower column address counter, and then produces lower decoding signals YAnb and YBnb (n=0, 1, ..., 15) selecting a specified lower normal column. Similarly, the upper decoder decodes upper normal column selection address signals A1t, $\overline{A1t}$~A8t, $\overline{A8t}$ from the upper column address counter, and then produces upper decoding signals YAnt and YBnt selecting a specified upper normal column. The lower decoder is disabled when the lower column decoder enable signals YEb is at an "L" level. The upper decoder is disabled when the upper column decoder enable signal YEt is at an "L" level.

Operation of the present preferred embodiment will now be explained referring to the accompanying circuit diagrams of FIGS. 2~10 and the timing diagrams of FIGS. 11 and 12.

To perform an erase verifying operation, an erase operation or block erase operation should be performed prior to the erase verifying operation. Erasing all memory cells in a selected row block is described in the above mentioned U.S. Pat. No. 5,473,563, the content of which was incorporated by reference.

Conventionally, to perform the erase verifying operation after erasing, an erase command, for example, a command of 60 (hexa code), is issued. Thereafter, an erase starting command, for example, a command of D0 (hexa code), is input. The erase verifying flag signal $\overline{Seravf}$ going to an "L" level is output from a command register (not shown) in response to the erase starting command, and the erase operation for a specified row block is executed for about 5 msec. This erase operation is terminated at time $t_0$ in FIG. 11.

After the completion of the erase operation, operation to reset the page buffer 16 is performed. To reset the page buffer, control signals BLSHF and SPB of FIG. 3 are held at "L" levels, and control signals DCB and SBL are put on "H" levels. Then, transistors 31 and 47 are turned off, and transistors 32 and 33 are turned on. Therefore, the first nodes 36 of data latches 35 constituting the page buffer are latched to "L" levels, while the second nodes 37 thereof are latched to "H" levels. After the reset operation for the page buffer 16, the erase sensing operation is begun at time $t_1$ to sense if memory cells in the specified row block are erased to have desired threshold voltages.

To perform this erase sensing operation, the control signals $\overline{\phi}_{blsh}$, DCB, SBL and SPB are kept at "L" levels, and the control signals BLSHF and $\phi_{sae}$ are held at "H" levels. Then, transistor 32, 33 and 47 are turned off, and transistors 31 and 45 are turned on. Therefore, the line 41 goes to an "L" level, thereby causing current source transistors 40 to be turned on. Therefore, current of about 4 µA is supplied to the memory cells of the specified row block via connecting points 34, transistors 31 and 30 and normal and redundant bit lines NBL0~NBL511 and RBL0~RBL7.

If the memory cells thereof are erased to have desired threshold voltages, the connecting points 34 maintain "L" levels, and thereby the transistors 38 are turned off. Therefore, the first nodes 36 of the data latches 35 maintain the reset states, i.e. pass data. If any one of the normal bit lines NBL0~NBL511 is opened, this open normal bit line is charged by the supplying current. When the potential of the connecting point 34 connected to the open bit line reaches at a predetermined potential, the transistor 38 connected thereto is turned on. Thereafter, the control signal $\phi_{lat}$ goes to an "H" level, and then the transistors 39 are turned on. Consequently, the second node 37 of the data latch associated with the open normal bit line is changed to an "L" level, and its first node 36 is changed to an "H" level. Therefore, the data latch 35 connected to the open normal bit line stores a fail data.

At time $t_2$, the erase sensing operation is terminated and operation for changing the fail data into the pass data is started.

For purposes of explanation, it will be assumed that a first normal bit line NBL0 of a first column CB0 is cut off and column address signals specifying the normal bit line NBL0 are all at "L" levels. It will also be assumed that the master fuse 61 and fuses 72, 74, . . . , 76 in the lower defective column program circuit 60-0 of FIG. 4 were blown.

Figure 11:
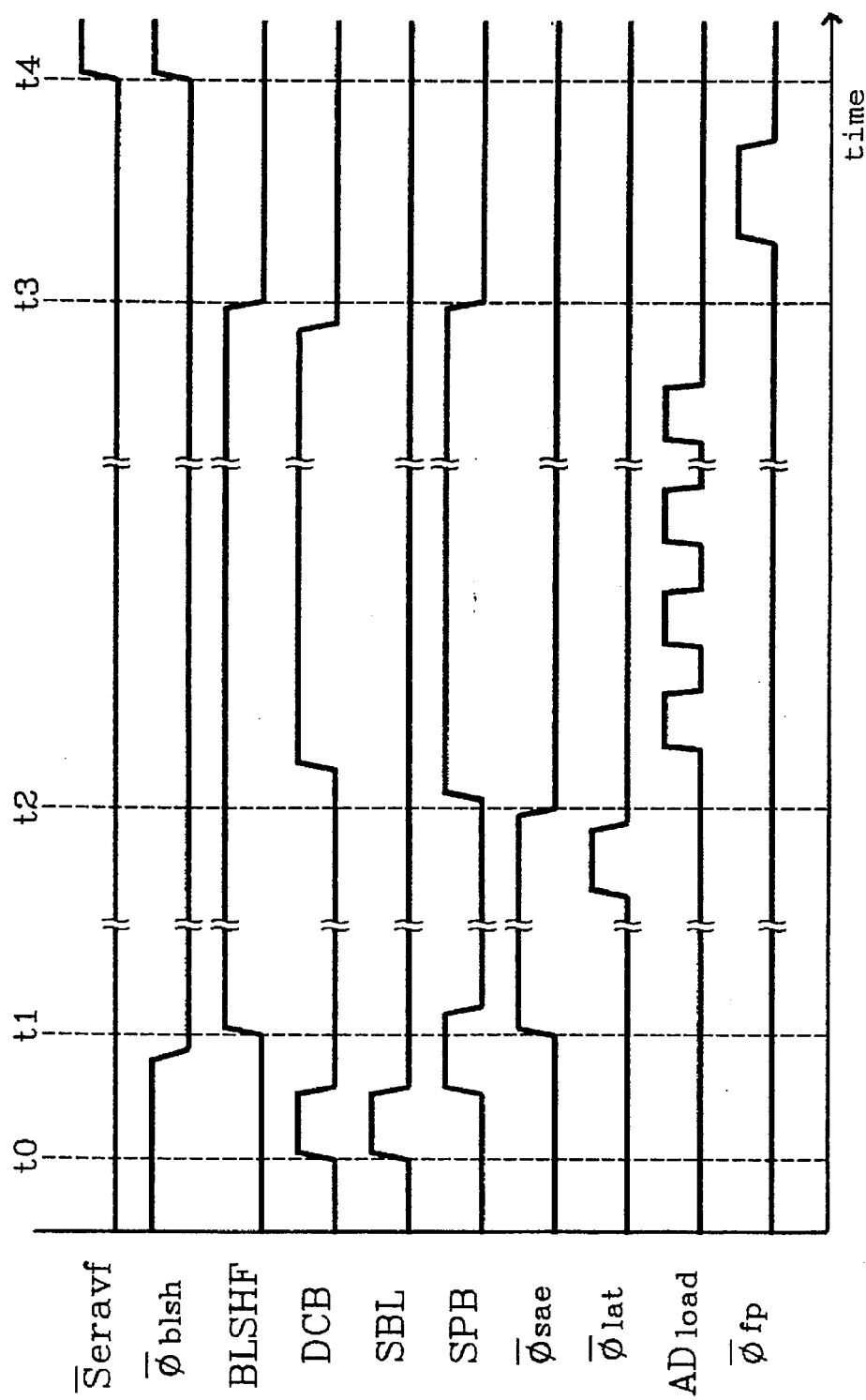
FIG. 11 is a timing diagram of various control signals during an erase verifying operation according to the present invention.
Figure 12:
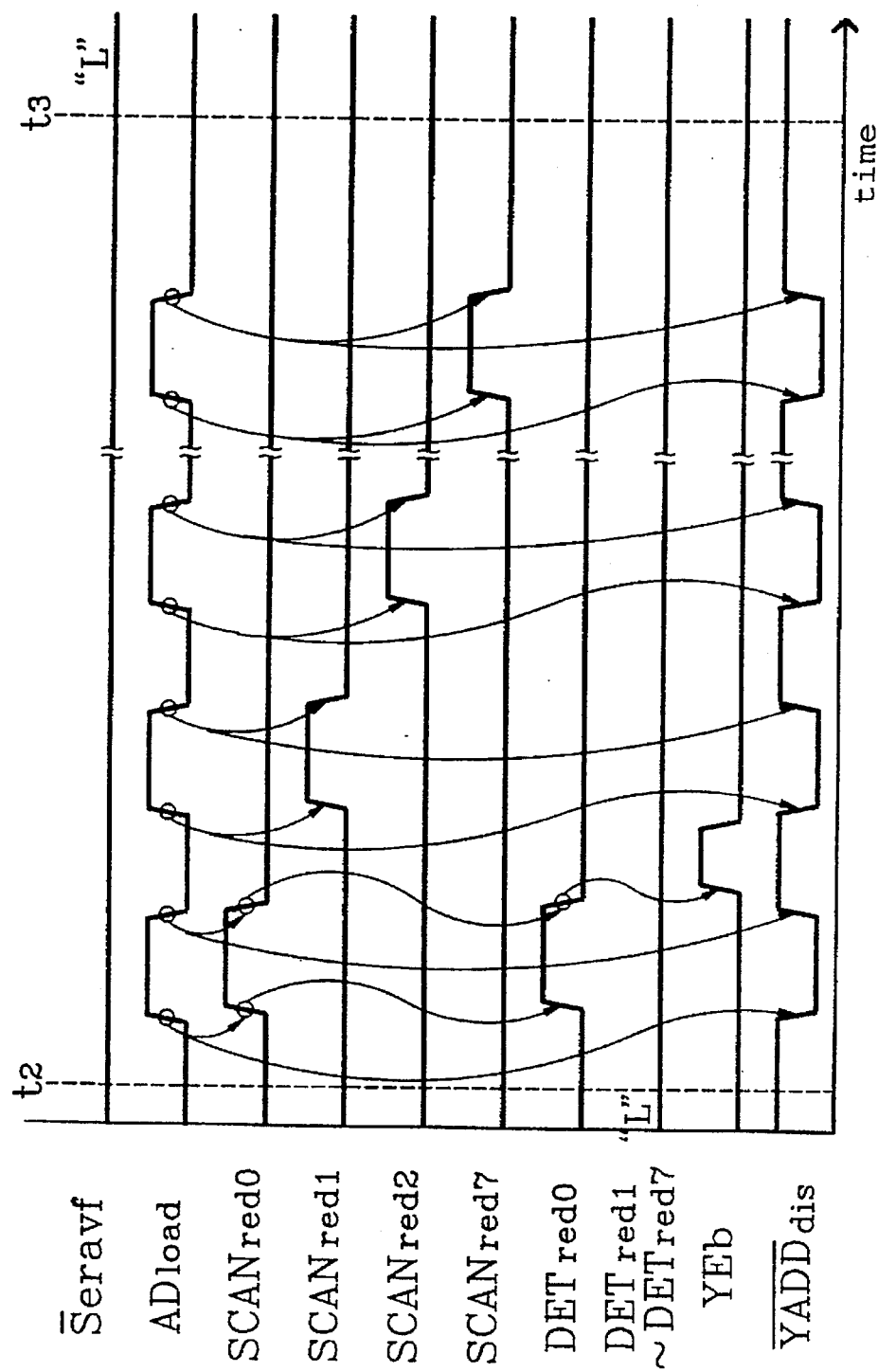
FIG. 12 is a detailed timing diagram of various control signals during a pass data changing period between the time $t_2$ and $t_3$ of FIG. 11.

A timing diagram of the fail data changing period between the time $t_2$ and $t_3$ of FIG. 11 is illustrated in detail between the time $t_2$ and $t_3$ of FIG. 12. Referring to FIG. 12, the address loading signal $AD_{load}$ is generated from a timer (not shown) with a cycle time of about 120 nsec after the time $t_2$. The defective column address loading control signal generator 100 of FIG. 5 generates the defective column address loading control signals $SCAN_{red0}$~$SCAN_{red7}$ and their complements $\overline{SCAN}_{red0}$~$\overline{SAN}_{red7}$, which synchronize with the signal $AD_{load}$, in response to the signal $AD_{load}$ and the erase verifying flag signal $\overline{S}_{eravf}$. The signals $SCAN_{red0}$, $\overline{SCAN}_{red0}$~$SCAN_{red7}$,$\overline{SCAN}_{red7}$ are respectively input to the defective column program circuits 60-0~60-7. Therefore, the line 64 of the lower defective column program circuit 60-0 is charged to an "H" level via conductive transistors 65 and 66 due to the blown master fuse 61 and conductive transistors 62 and 63. Then, the redundant detecting signal $DET_{red0}$ goes to an "H" level in response to an "H" level of the signal $SCAN_{red0}$.

However, the redundant column selection signal CR0 is maintained at an "L" level by the signal $\overline{S}_{eravf}$ at the "L" level. At the same time, when the signal $AD_{load}$ is at an "H" level, the column address disable signal $\overline{YADD}_{dis}$ of FIG. 7 is at an "L" level, and thereby the lower and upper normal column selection address signals A1b, $\overline{A1b}$~A8b, $\overline{A8b}$ and A1t, $\overline{A1t}$~A8t, $\overline{A8t}$ from the lower and upper column address counters of FIG. 9 are all at "L" levels. Therefore, transistors 77~82 of the circuit 60-0 are turned off, and the outputs RED01~RED08 of NOR gates 89~91 go to "L" levels.

When the signal $SCAN_{red0}$ is at the "H" level, the outputs of NOR gates 89~91 of the defective column program circuits 60-1~60-7 are all at "L" levels since the signals $SCAN_{red1}$~$SCAN_{red7}$ stay at "L" levels. Therefore, the lower repair address signal generator 165 of FIG. 8 produces the lower repair address signals RA1b~RA8b being at "L" levels. The counter stages 142~143 of FIG. 9 receive to latch the signals RA1b~RA8b when the signal $AD_{load}$ is at the "H" level. When the signal $SCAN_{red0}$ goes from "H" level to "L" level, the signal $DET_{red0}$ also goes from "H" level to "L" level. Then, the lower column decoder enable signal YEb of FIG. 6 becomes an "H" level short pulse. The signal $\overline{YADD}_{dis}$ of FIG. 7 goes to an "H" level when the signal $AD_{load}$ goes to the "L" level, and thereby the lower column address counter of FIG. 9 outputs the lower normal column selection address signals RA1b~RA8b being latched at "L" levels.

Then, the lower column decoder of FIG. 10 is enabled by the signal YEb of the "H" level, and then produces lower decoding signals YAnb and YBnb selecting the first normal bit line NBL0 of the first column block. Then, the pass data, i.e. the "L" level data, is input to the data latch 35 connected to the normal bit line NBL0 by the conductive transistor 58 of FIG. 3, thereby changing the "H" level fail data into the "L" level pass data.

Since fuses of defective column program circuits 60-1~60-7 are not blown, transistors 62 and 66 associated with these circuits are at nonconductive states, and thereby the lines 64 associated therewith are at initial states, i.e. discharged states at "L" levels. Therefore, the signals $DET_{red1}$~$DET_{red7}$ are at "L" levels, and thereby the upper column decoder enable signal YEt of FIG. 6 is at an "L" level. Therefore, the upper column decoder is at a disable state.

Returning to FIG. 11, the time duration between the time $t_3$ and $t_4$ provides a pass/fail determining period. During this period, if the data latches 35 store pass data when the pass/fail control signal $\phi_{fp}$ is at an "H" level, transistors 48 are at turn-off states, and the pass/fail determining signals $FP_k$ provide "H" levels with "H" levels charged on lines The signals $FP_k$ correspond to column blocks, respectively. The pass or fail state is determined by the logic combination of the signals $FP_k$.

If there is no defective normal bit line, fuses 61 and 71~76 of the defective column program circuits 60-0~60-7 of FIG. 4 are not blown. Then, the lines 64 of defective column program circuits stay at "L" levels, and thereby the redundant detecting signals $DET_{red0}$~$DET_{red7}$ are all at "L" levels during the erase verifying operation. Therefore, the lower and upper column decoder enable signals YEb and YEt of FIG. 6 are at disable states having "L" levels, and thereby the lower and upper column decoder of FIG. 10 are disabled. Consequently, the pass data on data lines 57 of FIG. 3 can not be transferred to the page buffer by the nonconductive states of column selection transistors 59.

As discussed above, the present invention has an advantage of enhancement of manufacturing yield, since including means for setting data lines to pass data, i.e. means for changing fail data, which is stored in data latches connected to open normal bit lines, into pass data with transistors 58.

Although the preferred embodiment of the present invention was explained for an EEPROM with first and second page buffers alternately connected to bit lines, it should be noted that the present invention is not limited to such an EEPROM.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A nonvolatile semiconductor memory comprising:

an array of rows and columns of floating gate type normal and redundant memory cells;

a plurality of normal bit lines each connected to a plurality of said normal memory cells in a corresponding column of said array;

a plurality of redundant bit lines each connected to a plurality of said redundant memory cells in a corresponding column of said array;

a page buffer connected to said normal and redundant bit lines for sensing and storing pass data and fail data read-out from selected normal memory cells in a desired row during an erase verifying operation of said memory after erasure of said selected normal memory cells, said pass data representing successful erasure of said selected normal memory cells and said fail data associated with at least one defective normal bit line; and a data changing circuit connected to said page buffer for changing said fail data stored in said page buffer into said pass data.

2. A nonvolatile semiconductor memory as recited in claim 1, wherein said data changing circuit comprises a column selection circuit connected to said page buffer for selecting said defective normal bit line, and a data changing transistor connected to said column selection circuit such that said pass data is transferred to said page buffer via said column selection circuit.

3. A nonvolatile semiconductor memory as recited in claim 1, further comprises at least a defective column program circuit for storing address signals specifying said defective normal bit line, and a column decoder connected to said column program circuit for decoding said address signals.

4. A method of verifying erasure of selected memory cells after erasure of said selected memory cells in a nonvolatile semiconductor memory, including a plurality of bit lines each respectively connected to a plurality of memory cells, a plurality of sensing circuits respectively connected to said bit lines for sensing pass data when said selected memory cells are successfully erased and fail data when at least one of said bit lines is defective, and a plurality of data latches respectively connected to said sensing circuit for storing said pass and fail data, said method comprising the step of changing said fail data stored in said data latch into said pass data, whereby said erase verifying is operable irrespective of the presence of a defect in one of said bit lines.

* * * * *